United States Patent
Varadarajan et al.

(10) Patent No.: US 10,600,495 B2
(45) Date of Patent: Mar. 24, 2020

(54) PARALLEL MEMORY SELF-TESTING

(71) Applicant: Texas Instruments Incorporated, Dallas, TX (US)

(72) Inventors: Devanathan Varadarajan, Plano, TX (US); Sumant Kale, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 94 days.

(21) Appl. No.: 15/891,789

(22) Filed: Feb. 8, 2018

(65) Prior Publication Data

US 2018/0374556 A1 Dec. 27, 2018

Related U.S. Application Data

(60) Provisional application No. 62/524,326, filed on Jun. 23, 2017, provisional application No. 62/538,293, filed on Jul. 28, 2017.

(51) Int. Cl.
*G11C 29/38* (2006.01)
*G11C 29/26* (2006.01)
*G11C 29/36* (2006.01)

(52) U.S. Cl.
CPC .......... *G11C 29/38* (2013.01); *G11C 29/26* (2013.01); *G11C 29/36* (2013.01)

(58) Field of Classification Search
CPC .................................................. G11C 29/56
USPC .......................................... 714/719, 722, 711
See application file for complete search history.

(56) References Cited

U.S. PATENT DOCUMENTS

| | | | |
|---|---|---|---|
| 5,883,843 | A | 3/1999 | Hii et al. |
| 5,923,599 | A | 7/1999 | Hii et al. |
| 6,353,563 | B1 | 3/2002 | Hii et al. |
| 6,801,461 | B2 | 10/2004 | Hii et al. |
| 6,898,749 | B2 | 5/2005 | Whetsel et al. |
| 7,834,615 | B2 | 11/2010 | Jarboe, Jr. et al. |
| 8,667,260 | B2 * | 3/2014 | Eichenberger ............ G06F 9/32 712/241 |
| 2005/0144525 | A1 | 6/2005 | Heragu et al. |
| 2006/0242521 | A1 | 10/2006 | Hii et al. |
| 2008/0235547 | A1 | 9/2008 | Chan |
| 2008/0320351 | A1 | 12/2008 | Whetsel et al. |
| 2009/0013228 | A1 | 1/2009 | Jarboe, Jr. et al. |

(Continued)

OTHER PUBLICATIONS

Davanathan et al., "AReconfigurable Built-in Memory Self-repair Architecture for Heterogeneous Cores with Embedded BIST Datapath", 2016 IEEE International Test Conference, Nov. 2016, 6 pages.

*Primary Examiner* — Fritz Alphonse
(74) *Attorney, Agent, or Firm* — Ebby Abraham; Charles A. Brill; Frank D. Cimino

(57) ABSTRACT

In described examples of circuitry and methods for testing multiple memories, a controller generates a sequence of commands to be applied to one or more of the memories, where each given command includes expected data, and a command address. Local adapters are individually coupled with the controller and with an associated memory. Each local adapter translates the command to a memory type of the associated memory, maps the command address to a local address of the associated memory, and provides test results to the controller according to read data from the local address of the associated memory and the expected data of the command.

20 Claims, 5 Drawing Sheets

(56) References Cited

U.S. PATENT DOCUMENTS

| | | |
|---|---|---|
| 2009/0077441 A1* | 3/2009 | Huynh .................. G06F 11/261 |
| | | 714/741 |
| 2009/0204861 A1 | 8/2009 | Cleavelin et al. |
| 2010/0229056 A1 | 9/2010 | Cleavelin et al. |
| 2011/0026343 A1 | 2/2011 | Jarboe, Jr. et al. |
| 2011/0176374 A1 | 7/2011 | Jarboe, Jr. et al. |
| 2013/0275822 A1 | 10/2013 | Damodaran et al. |
| 2014/0164856 A1 | 6/2014 | Damodaran et al. |
| 2014/0189450 A1 | 7/2014 | Varadarajan et al. |
| 2015/0067426 A1 | 3/2015 | Nardini et al. |
| 2016/0365156 A1* | 12/2016 | Busi ....................... G11C 29/18 |
| 2017/0125125 A1 | 5/2017 | Narayanan et al. |
| 2017/0157524 A1 | 6/2017 | Narayanan et al. |

* cited by examiner

PARALLEL MEMORY SELF-TESTING

CROSS-REFERENCE TO RELATED APPLICATIONS

This application claims priority to, and the benefit of, U.S. Provisional Patent Application No. 62/524,326, entitled "A Hierarchical, Power-Safe, Parallel Memory Self-Test Architecture for In-Field Test" filed Jun. 23, 2017, the entirety of which is hereby incorporated by reference. This application claims priority to, and the benefit of, U.S. Provisional Patent Application No. 62/538,293, entitled "A Hierarchical, Power-Safe, Parallel Memory Self-Test Architecture for In-Field Test" filed Jul. 28, 2017, the entirety of which is hereby incorporated by reference.

BACKGROUND

Built-in self-test (BIST) circuitry and systems are used for automated testing of target circuits during product manufacturing and/or during circuit operation, such as on power up. Many BIST circuits include a controller that produces test conditions for one or more target circuits, and receives or analyzes responses to identify any faulted target circuitry. The target circuits may be electronic memory, and the self-test can include writing of the desired data pattern to an embedded memory, and then addressing the memory to retrieve and compare the stored data to the expected data. In certain product applications, BIST circuits need to complete testing in a predetermined time, during which circuit power may be limited. Also, BIST circuits can occupy significant circuit area, particularly where a BIST controller is provided for each of a number of target circuits.

SUMMARY

In described examples of methods and circuitry to test multiple memories, a controller generates a sequence of commands to be applied to one or more of the memories, where each given command includes expected data, and a command address. Local adapters are individually coupled with the controller and with an associated memory. Each local adapter translates the command to a memory type of the associated memory, maps the command address to a local address of the associated memory, and provides test results to the controller according to read data from the local address of the associated memory and the expected data.

DETAILED DESCRIPTION

Figure 1:
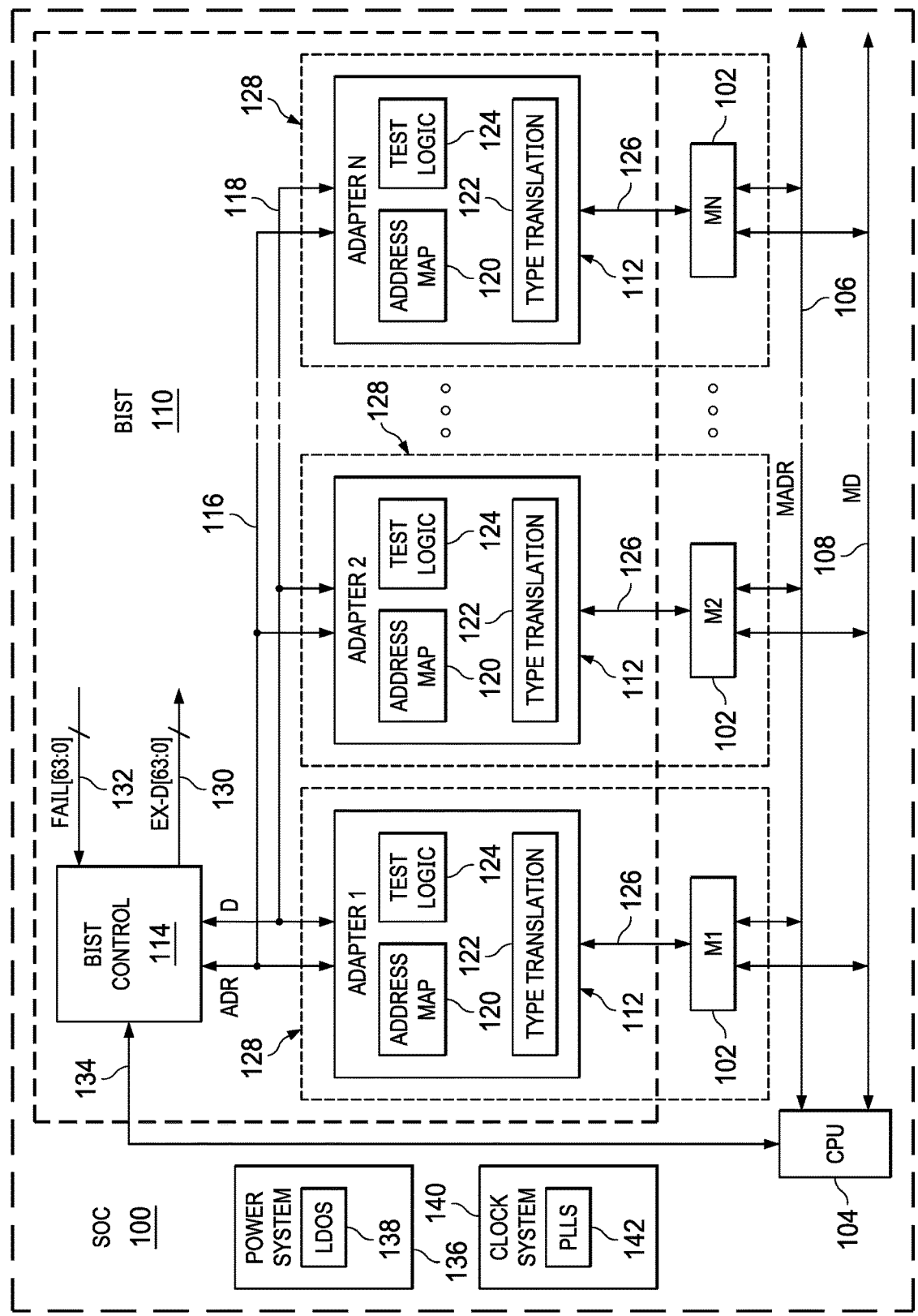
FIG. 1 is a schematic diagram of a system on chip (SoC) or integrated circuit with a BIST system to test multiple memories in parallel.

In the drawings, like reference numerals refer to like elements throughout, and the various features are not necessarily drawn to scale.

FIG. 1 shows a system on chip (SoC) or integrated circuit (IC) 100 with an integer number N memories or memory circuits 102 (labeled M1, M2, . . . MN), where N is greater than 1. The example IC 100 also includes a processor circuit 104, for example, a central processing unit (CPU). The CPU 104 exchanges data with the memories 102 via a multi-bit main address bus 106 (labeled MADR) and a multi-bit main data bus 108 (labeled MD).

The IC 100 includes circuitry 110 (labeled BIST) that performs parallel testing of the memories 102. The BIST circuitry 110 includes a plurality of local adapters 112. Each local adapter 112 is operatively coupled with a particular one of the memories 102, referred to as the associated memory 102. In addition, the circuitry 110 includes a control circuit or controller 114 (labeled BIST CONTROL) operatively coupled with the local adapters 112. The controller 114 generates a sequence of commands to be applied to one or more of the memories 102. In one example, each given command of the sequence includes expected data and a command address to perform memory write/read back testing of two or more of the memories 102 concurrently. The controller 114 and the local adapters 112 in one example are configured according to a low-power test sequence heuristic that concurrently tests two or more of the memories 102 so that all the memories 102 are tested within a predetermined time limit while enforcing a maximum instantaneous power limit.

The circuitry 110 can be used in a variety of applications, for example, automotive or other product implementations in which self-testing is done on system power up or in other situations where self-testing must be completed within a predetermined time limit. In addition, the circuitry 110 advantageously facilitates performing memory self-testing within a predetermined power limit. In one example, the IC 100 is part of an automotive system that is powered up when a vehicle is started. The circuitry 110 begins operation and is used to test the operation of the memories 102 before certain subsystems are operational. In one possible application, the circuitry 110 may implement parallel testing of the memories 102 to complete the self-test within a maximum time duration (e.g., boot time) that expires before certain clock circuits and power systems are operating. In this situation, the instantaneous power available to the circuitry 110 for testing the memories 102 is limited.

In the examples illustrated below, the circuitry 110 performs parallel memory testing according to a low-power test scheduling heuristic, in which the local adapters 112 intelligently translate the commands from the controller 114 according to a memory type of the associated memory 102 and map command addresses to local addresses of the associated memory 102 according to the test schedule. In one example, the local adapters 112 are configurable or programmable. The translation and mapping features of the example adapters 112 facilitate use with general purpose BIST controllers 114 to accommodate use with any number of different topologies and types of associated memories 102. For example, type translation features of a local adapter 112 can be configured or programmed for use with single port or multi-port memory types. In addition, memory mapping features of a local adapter 112 can accommodate a variety of different memory data widths and/or memory address ranges. The configuration of multiple local adapters 112 in the illustrated examples facilitates testing of multiple memories 102 in parallel to complete memory self-testing within a particular time limit (e.g., an automotive system maximum boot time) while controlling power consumption within a particular instantaneous power limit (e.g., limited power available during system boot time). In one example, the circuitry 110 implements the memory self-testing using a single clock source for memory configurations in which the individual memories 102 are later operated according to different clocks. This allows fast, low-power memory self-testing before low dropout (LDO) regulator and other power systems are fully operational, and before phase lock loop (PLL) circuits are operating in a given host system.

In one example, the controller 114 is operatively coupled with the individual adapters 112 via a control address_bus 116 (labeled ADR) and a control data bus 118 (labeled D). In operation, the controller 114 in this example performs memory self-testing by issuing a sequence of commands on the buses 116 and 118. In one example, the commands are single-port commands that include a command address and expected data. The local adapters 112 in one example perform local write/read back tests in which the expected data from the command is written to the associated memory 102 at a local address map from the command address. The individual adapters 112 then read from the same local address associated with the command, and compare the read data from the memory 102 with the expected data from the command. The local adapters 112 then send test results data back to the controller 114 via the buses 116 and 118 according to (e.g., in response to or based upon) the comparison.

The circuitry 110 implements a distributed self-test architecture in which the adapters 112 implement local compare functions to interface a corresponding memory 102. This provides faster self-testing for multiple memories 102 compared with a single BIST controller that sequentially tests each local memory 102. The illustrated examples also consume less power during parallel testing, and occupy significantly less circuit space, compared with fully distributed architectures in which a dedicated BIST controller is provided for each tested memory 102. In one example, the memories 102, the controller 114, and the local adapters 112 are formed in a single integrated circuit 100.

The individual local adapters 112 map the command address to a local address of the associated memory 102. In one example, each local adapter 112 includes an address mapping circuit 120 to map the command address to the local address of the associated memory 102. In one example, the address mapping circuit 120 includes an address input coupled to a control address bus 116 coupled with the controller 114 (labeled ADR). The address input of the individual adapters 112 receives first address signals that represent the command address of a given command from the controller 114 via the control address bus 116. As discussed further in connection with FIG. 3 below, the individual adapters 112 in one example include a switching circuit that generates second address signals representing the local address of the associated memory 102 according to (e.g., in response to or based upon) the first address signals and a configuration signal. In one example, the address mapping circuit 120 also includes a programmable circuit to provide the configuration signal (e.g., a programmable register).

In addition, the individual local adapters 112 translate a given command from the controller 114 to a memory type of the associated memory 102. In one example, the individual local adapters 112 include a type translation circuit 122 that disables the associated memory 102 in response to the command address being outside a range. In this manner, the local adapter 112 conserves power during the distributed self-testing of the memories 102. In one example, the range of each individual adapter 112 is programmable. In one example, the type translation circuit 122 translates a single port command from the controller 114 to a multi-port memory type of the associated memory 102. This facilitates testing of dual-port memories and other multi-port memory types using single-port commands from the controller 114. In one example, the type translation circuit 122 enables a selected port of the associated multi-port memory 102 and disables other non-selected ports in response to the command address being in the local address range of the selected port. The type translation circuit 122 disables all ports of the associated multi-port memory 102 in response to the command address being outside the local address ranges of each port of the associated multi-port memory 102. In one example, the address mapping circuit 120 maps a command address range into first and second local address ranges for an associated dual port memory 102. The type translation circuit 122 enables a first port of the associated dual port memory 102 and disables a second port of the associated dual port memory 102 in response to the command address being in the first local address range. In this example, moreover, the type translation circuit 122 enables the second port and disables the first port in response to the command address being in the second local address range, and disables both ports (e.g., disables the associated dual port memory 102) in response to the command address being outside the first and second local address ranges.

The individual adapters 112 also transfer the expected data to the local address of the associated memory 102, for example, in a local write operation. The individual adapters 112 then read data back from the local address and compare the read data from the memory 102 with the expected data. The local adapters 112 provide test results to the controller 114 according to (e.g., in response to or based upon) the read data from the local address of the associated memory 102 and the expected data of the given command. In one example, each local adapter 112 includes a test logic circuit 124 that compares the read data from the local address of the associated memory 102 and the expected data of the given command. The test logic circuit 124 provide the test results to the controller 114 according to differences between the read data from the local address of the associated memory 102 and the expected data of the given command.

The adapters 112 are individually operatively coupled with the associated memories 102 via local interconnections 126 as schematically shown in FIG. 1. In a single integrated circuit example implementation, the interconnections 126 include a conductive interconnects for address, data, and control lines to operate the associated memory 102 under control of the local adapter 112. In addition, as shown in the example of FIG. 1, the adapter 112 and the associated memory 102 can be integrated. For example, the local adapter circuitry 112 can be included within a memory IC 128.

In the example of FIG. 1, the main address and data buses 106 and 108 are separate from the self-testing address and data buses 116 and 118, although not a requirement of all possible implementations. FIG. 1 also shows multi-bit interconnections 130 by which the controller 114 can provide the expected data (e.g., EX-D[64:0]) to the individual local adapters 112. This example also includes multi-bit interconnections 132 by which the local adapters 112 provide the test results (e.g., FAIL [63:0]) to the controller 114. In other possible implementations, the expected data and test results can be transferred between the controller 114 and the local adapters 112 along the test data bus 118.

The example IC 100 in FIG. 1 also provides interconnection 134 between the CPU 104 and the controller 114. For example, this can allow the controller 114 to implement one or more self-test functions to test the CPU 104. In other possible examples, the interconnection 134 can be omitted. The illustrated example also includes a power system 136 with one or more LDO circuits 138. In one example, the LDO circuits 138 are not functional during the memory self-testing, but become operational after the memories 102 have been tested, to provide local power supply signaling to one or more circuits of the IC 100. The IC 100 further includes a clock system 140 with one or more PLL circuits 142. In one example, the PLL circuits 142 are not functional during memory self-testing, but become operational after the memories 102 have been tested.

Figure 2:
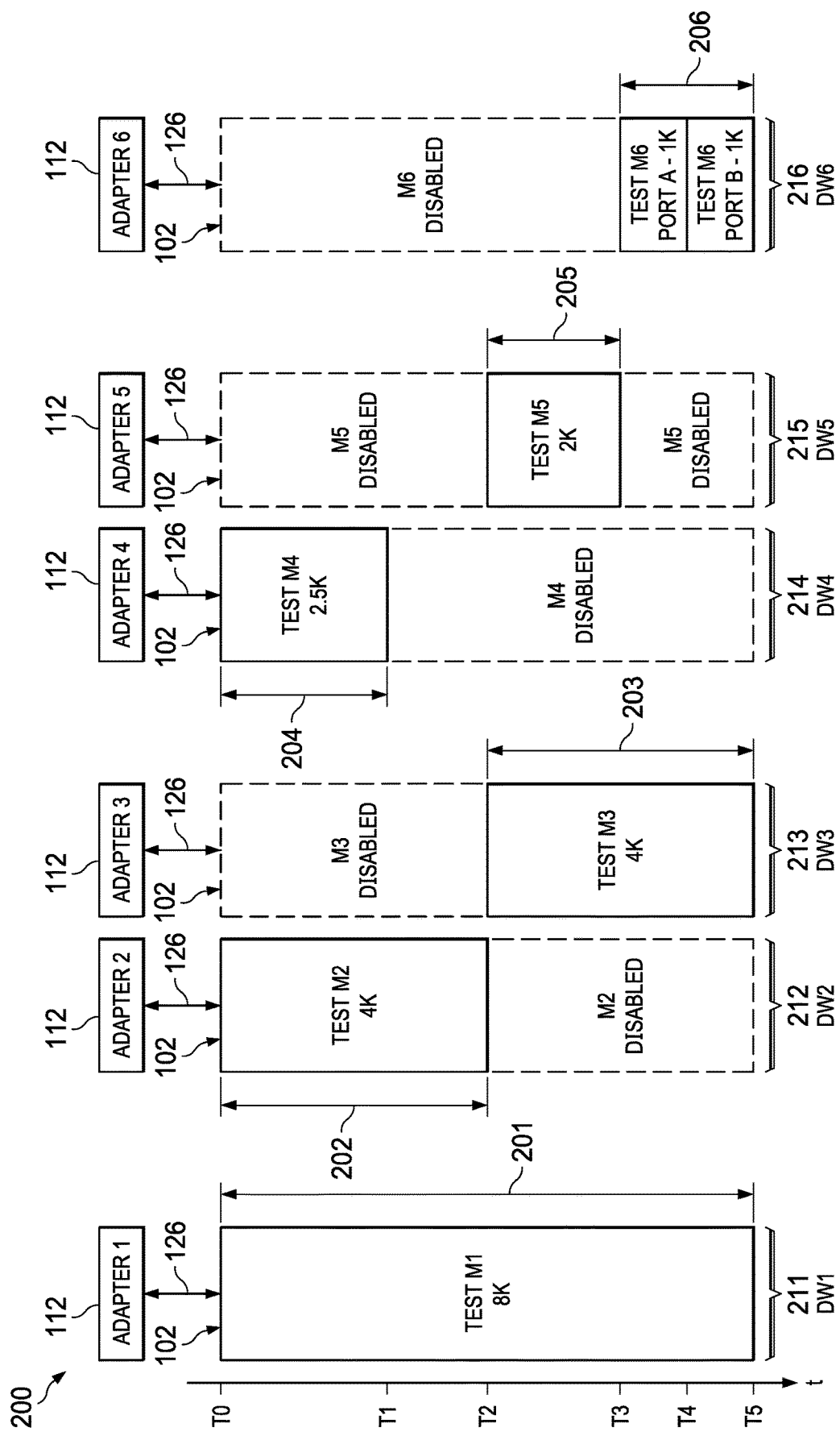
FIG. 2 is a schematic diagram of an example set of six memories illustrating a parallel test schedule determined according to a low power scheduling heuristic.

FIG. 2 shows an example set of six memories 102 (labeled M1, M2, M3, M4, M5 and M6) and associated adapters 112 and interconnections 126. This example schematically illustrates a parallel test schedule 200 from a start time T0 to a finish time T5. In this example, the first memory 102 (M1) has an address range 201 spanning 8K addresses, and a data width 211 (labeled DW1). The address ranges in the described examples are discussed in terms of rounded numbers for ease of description. For example, the address range 201 is described as 8K, although the actual range is 8192 addresses (e.g., $2^{13}$). The second example memory 102 (M2) has an address range 202 of 4K addresses and a data width 212 (labeled DW2). The third memory 102 (M3) has an address range 203 of 4K addresses and a data width 213 (labeled DW3). The fourth memory (M4) has an address range 204 of 2.5 K addresses and a data width 214 (labeled DW3). The fifth example memory (M5) has an address width 205 of 2K addresses and a data width 215 (labeled DW5). The last memory M6 in this example is a dual-port memory, including a first port (labeled TEST M6 PORT A-1K) with a first local address width of 1K addresses, as well as a second port (labeled TEST M6 PORT B-1K) with a second local address width of 1K addresses. As shown in the schematic illustration of FIG. 2, the first and second ports of the memory M6 together represent an address range 206 of 2K addresses. The dual-port memory M6 has a data width 216 (labeled DW6). The memories 102 in this example can have similar data widths 211-216, or the data widths 211-216 can be different.

The parallel memory test schedule 200 illustrated in FIG. 2 is determined according to a low power scheduling heuristic. In this example, the heuristic involves identifying the memory (e.g., M1) with the longest address range 201 (e.g., 8K addresses). This memory M1 is tested throughout the schedule beginning at T0 and completing at T5. The controller (114 in FIG. 1) issues commands one at a time, each including a single port type command address beginning at zero and ending at 8K. In one example, the controller 114 issues commands having 16-bit addresses and 64 bit data widths in a single-port memory type format. Other address ranges and data widths can be used in other implementations. The local adapters 112 perform address mapping and type translation to generate local signaling to test the associated memories 102 according to (e.g., in response to or based upon) the single-port memory format commands from the controller 114.

The heuristic used in the example of FIG. 2 schedules one or more of the remaining memories M2-M6 for concurrent testing in parallel with the testing of the first memory M1. During an initial phase of the testing, the second and fourth memories M2 and M4 are scheduled for parallel testing with the first memory M1 with commands for addresses from zero through 2.5K during a first time interval from time T0 through T1. In addition, from T0 through T1, the local adapters 112 associated with the memories M3, M5 and M6 disable those memories. Accordingly, during the first time interval from T0 through T1, only the currently tested memories M1, M2 and M4 are enabled, and power consumption of the tested circuit is minimized or reduced compared to approaches in which all the tested circuits are powered throughout the testing. At T1, the fourth memory M4 has been completely tested, and the local adapter 112 for the memory M4 disables that memory to further conserve power. From T1 through T2 (e.g., until the command address reaches 4K), the testing of memories M1 and M2 continues.

At time T2, the testing of M2 is completed, and the corresponding local adapter 112 disables the memory M2 for the remainder of the test schedule. At T2, moreover, the local adapters 112 associated with memories M3 and M5 enable those memories. From T2 through T3 in the illustrated schedule, M1 is concurrently tested with the memories M3 and M5. At time T3, the testing of the 2K memory M5 is completed, and the adapter 112 associated with M5 disables that memory for the remainder of the testing. From T3 through T4, the illustrated schedule tests M1, M3 and a first port (e.g., port A) of the dual-port memory M6. This parallel testing of M1, M3 and the first port of M6 continues until a time T4 (e.g., corresponding to address 7K). At this point, the local adapter 112 corresponding to the memory M6 disables the first port (e.g., port A) and enables the second port (e.g., port B) of the dual-port memory M6. In this configuration, the controller 114 issues the remaining commands for the final address range from 7K through 8K (e.g., time interval from T4 through T5) to complete testing of M1, M3 and the second port of M6.

As shown in FIG. 2, the testing schedule intelligently balances power while minimizing testing time. In this example, of the six tested memories M1-M6, three or fewer memories are enabled at any given time, and the remaining memories are disabled. This controls the instantaneous power at any given time between T0 and T5. At the same time, the parallel (e.g., concurrent) testing of at least two of the memories at any given time facilitates fast completion of the test schedule. This example illustrates a low-power fast schedule resulting from a low-power scheduling heuristic. The determined schedule is reflected in the configuration of the local adapters 112 to accommodate the different address ranges 201-206 as well as accommodating any differences in the data widths 211-216. Moreover, the adapters 112 advantageously provide for memory type translation, for example, to effectively utilize single port commands from the controller 114 to implement individual testing of the ports A and B of the memory M6.

Figure 3:
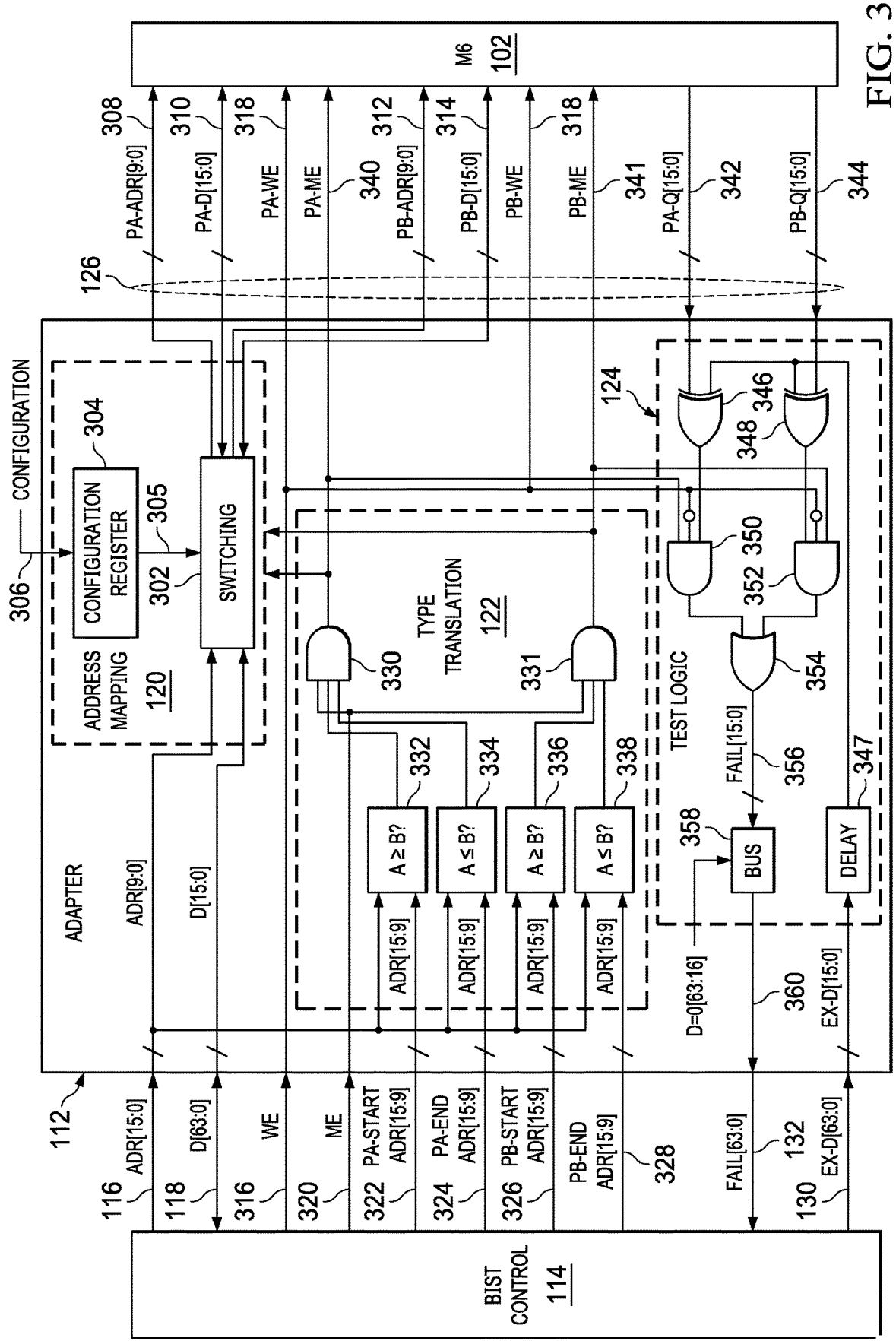
FIG. 3 is a schematic diagram of an example adapter circuit.

FIG. 3 shows further details of an example adapter circuit 112, operatively coupled with the example controller 114 via the address and data buses 116 and 118. The example adapter 112 is also operatively coupled with the dual port memory M6 via the interconnections 126 in the above-described example. The address mapping circuit 120 maps the command address to a local address of the associated memory 102. The address mapping circuit 120 includes a switching circuit 302 coupled to receive first address signals (e.g., ADR[9:0]) which represent the command address. The switching circuit 302 generates second address signals (e.g., PA-ADR[9:0], PB-ADR[9:0]) representing a local address of the associated memory 102 according to the first address signals ADR[9:0] and a configuration signal. For write/read back self-testing of the memory 102, the adapter 112 receives the test expected data from the command, and transfers (e.g., writes) the expected data to the local address of the associated memory 102. The adapter 112 then reads the memory from the same local address. The test logic circuit 124 is coupled with the associated memory 102 to receive read data from the local address and compare the read data with the expected data, delayed to match the memory latency. The test logic circuit provides test results according to differences between the read data from the local address and the expected data.

The address mapping circuit 120 includes a switching circuit 302 and a programmable circuit 304 (e.g., a configuration register). An output 305 of the configuration register 304 provides a configuration signal (e.g., single or multi-bit) to the switching circuit 302. In one example, the configuration register 304 has an input 306 to allow programming of the configuration register 304 (e.g., single or multi-bit) according to configuration data (e.g., labeled CONFIG). Any configuration source can be used to provide the configuration data to the configuration register input 306. In one example, the register 304 is configured during manufacturing of the adapter circuit 112. In other examples, the configuration register 304 can be reprogrammed during use, for example, by the CPU 104 in FIG. 1.

The address mapping circuit 120 includes an input coupled to receive the first address signals ADR[9:0] from the control address bus 116. In the illustrated example, the control address bus is a 16 bit bus including signals ADR [15:0], and the 1K address range of each of the separately tested ports of the memory M6 are 10 bits (e.g., ADR[9:0]). The switching circuit 302 receives the relevant 10 bits of the first address signals ADR[9:0]. The switching circuit 302 also includes a multi-bit input coupled to the control data bus 118 to receive and transmit data signals. In one example, the control data bus 118 is 64 bits wide to accommodate data signals D[63:0], and the data width 216 of the tested memory M6 is 16 bits (e.g., D[15:0]). The switching circuit 302 receives the relevant 16 bits of the data bus signals ADR[9:0].

The address mapping circuit interconnections 126 to the associated memory 102 include port-specific, multi-bit address and data outputs 308, 310, 312 and 314 of the switching circuit 302. The outputs 308, 310, 312, 314 are connected to corresponding inputs of the associated memory 102 (M6). In one example, a 10 bit first data output 308 generates second address signals (e.g., labeled PA-ADR[9:0]) that represent the local address of the first port (PORT A) of the associated memory M6 according to (e.g., in response to or based upon) the first address signals ADR[9:0] of the command and according to the configuration signal from the configuration register 304. A first data output 310 of the switching circuit 302 writes and/or reads 16-bit first data signals (e.g., labeled PA-D[15:0]) to and/or from the first port data connections of the memory M6.

For the second memory port (PORT B), a 10 bit second data output 312 of the switching circuit 302 generates second address signals (e.g., labeled PB-ADR[9:0]) that represent the local address of the second port of the memory M6 according to (e.g., in response to or based upon) the first address signals ADR[10:0] of the command and the configuration signal. A second switching circuit data output 314 writes and/or reads 16-bit second data signals (e.g., labeled PB-D[15:0]) to and/or from the second port data connections of the memory M6.

The switching circuit 302 can include any suitable switches (e.g., transistors) forming interconnections that map the command address signals ADR[9:0] to the local address signals PA-ADR[9:0] and PB-ADR[9:0] to implement a memory test command. For example, a write of the expected data via the signals D[15:0] is implemented to write the data to the corresponding enabled port of the memory M6, and a subsequent read back operation delivers read data signals PA-D[15:0] and PB-D[15:0] to the local data bus 118 through the switching circuit 302 according to the configuration signal from the configuration register 304. In another example, the configuration of the switching circuit is fixed and the configuration register 304 is omitted. For instance, the switching circuit 302 in the Example of FIG. 3 can include multiplexer circuitry to connect the control address bus signals ADR[9:0] of the address bus 116 to either the signals PA-ADR[9:0] at the port address output 308 or to the signals PB-ADR[9:0] at the port address output 312 when the command address is in the corresponding port sub ranges of the memory M6. In one example, the switching circuit 302 includes further multiplexer circuitry to connect the data signals D[15:0] of the control data bus 118 to either the signals PA-D[15:0] at the port address output 310 or to the signals PB-D[15:0] at the port address output 314 when the command address is in the corresponding port sub ranges of the memory M6. In the example of FIG. 3, the address mapping circuit 120 receives gating signals from the type translation circuit 122 indicating whether the command address of a given command is within one of the port address sub ranges.

In the example adapter 112 of FIG. 3, the controller 114 includes as write enable output 316 that delivers a write enable signal WE to the adapter 112. The adapter 112 provides the signal WE directly as a first port write enable signal PA-WE to the first port of the associated memory 102 at a first port write enable output 318. The adapter 112 also provides the signal WE directly as a second port write enable signal PB-WE to the second memory port at the output 318.

The type translation circuit 122 selectively disables all or select portions of the associated memory M6 in response to the command address being outside a range. In the example of FIG. 3, the range is programmable. For the illustrated dual port memory M6, the range is 2K addresses (e.g., 2048) from 6K to 8K, partitioned into 1K sub ranges for the first and second ports. For the example of FIG. 2, the range for M1 is from 0 to 8K (e.g., 4095), the range for M2 is from 0 through 4K, the range for M3 is from the next address (e.g., 4096) through 8K (e.g., 8191). In this example, the range for M4 is from 0 through 2.5K, the range for M5 is from 4K through 6K, the range for the first port (PORT A) of M8 is from 6K to 7K, and the range for the second port (PORT B) of M6 is from 7K to 8K. The address mapping and type translation circuits 120 and 122 of the associated adapter circuits 122 set these ranges, either through programming or other configuration (e.g., fixed or reconfigurable). The type translation circuits 122 of the corresponding adapter circuits 112 disable the associated memories (or portions thereof) in respond to the command address of a given command being outside the corresponding configured range.

The type translation circuit 122 in FIG. 3 translates single port commands into dual port operation to test the power A and B of the associated memory 102 (M6). The adapter 112 includes a memory enable input 320 that receives an enable signal ME from the controller 114. The adapter 112 also includes inputs 322, 324, 326 and 328 to receive configuration data that defines start and end addresses for the first and second ports (port A and port B) of the associated dual-port memory M6. The type translation circuit 122 receives the configuration signals from the inputs 322, 324, 326 and 328 and compares these with the 10 bit address signals ADR[9:0] from the controller 114. The type translation circuit 122 also includes AND gates 330 and 331 that provide port-specific memory enable signals to the associated memory M6. The outputs of the AND gates 330 and 331 are also provided as input signals to the address mapping circuit 120 in this example. The type translation circuit 122 includes four address comparator circuits 332, 334, 336 and 338. Each of the address comparator circuits includes a seven bit input connected to the control address bus 116 to receive the command address signals ADR[15:9].

The address range configuration input 322 receives first port start address data PA-STARTADR[15:9], and provides this as a second seven bit input to a first address comparator 332. The comparator 332 provides an output signal to the first AND gate 330 in an active (e.g., high) state when (e.g., in response to or based upon) the value of the command address signals ADR[15:9] is greater than or equal to the first port start address data PA-STARTADR[15:9]. The address range configuration input 324 receives first port end address data PA-ENDADR[15:9], and provides this as a second seven bit input to the second address comparator 334. The comparator 334 provides an output signal to the first AND gate 330 in an active (e.g., high) state when (e.g., in response to or based upon) the value of the command address signals ADR[15:9] is less than or equal to the first port end address data PA-ENDADR[15:9]. The first AND gate 330 provides an active high first port memory enable signal PA-ME at an output 340 when (e.g., in response to or based upon) the controller 114 asserts the memory enable signal ME and the command address is within the first range defined by the first port start and end addresses PA-STARTADR[15:9] and PA-ENDADR[15:9], respectively.

The address range configuration input 326 receives second port start address data PB-STARTADR[15:9], and provides this as a second seven bit input to the third address comparator 336. The comparator 336 provides an output signal to the second AND gate 331 in an active (e.g., high) state when (e.g., in response to or based upon) the value of the command address signals ADR[15:9] is greater than or equal to the second port start address data PB-STARTADR[15:9]. The address range configuration input 328 receives second port end address data PB-ENDADR[15:9], and provides this as a second seven bit input to the fourth address comparator 338. The comparator 338 provides an output signal to the second AND gate 331 in an active (e.g., high) state when (e.g., in response to or based upon) the value of the command address signals ADR[15:9] is less than or equal to the second port end address data PB-ENDADR[15:9]. The second AND gate 331 provides an active high second port memory enable signal PB-ME at an output 341 when (e.g., in response to or based upon) the controller 114 asserts the memory enable signal ME and the command address is within the second range defined by the respective second port start and end addresses PB-STARTADR[15:9] and PB-ENDADR[15:9].

In operation, the type translation circuit 122 selectively enables only one of the two ports of the memory M6 according to the command address data from the controller 114, and selectively disables both ports of the memory M6 when the command address is not within the first or second port address sub ranges. In the illustrated example, the inputs 322, 324, 326 and 328 receive the address range configuration signals from the controller 114. In other possible limitations, the adapter 112 receives the address range configuration input signals from a different source (e.g., from the CPU 104 in FIG. 1 or other circuit, not shown) to reconfigure the start and end addresses. In other examples, the start and end addresses for the first and second ports are predetermined, and the configuration data inputs 322, 324, 326 and 328 can be omitted.

The test logic circuit example 124 in FIG. 3 includes a 16 bit input 130 that receives signals representing 16 bits (EX-D[15:0]) of the 64 bit expected data EX-D[63:0] from the controller 114 for a given command. The test logic circuit 124 also includes first and second 16-bit inputs 342 and 344 coupled with the associated memory 102 to receive read data from the local address. The test logic circuit 124 compares the read data with the expected data in a write/read back operation for each received command with a command address in the configured range or group of sub ranges. Where the first port (port A) is being tested, the associated read operation of the local address provides 16-bit signals at the input 342 representing the port A read data PA-Q[15:0]. If the second port (port B) is being tested, the read operation of the memory 102 provides 16-bit signals at the input 344 representing the port B read data PB-Q[15:0].

The test logic circuit 124 compares the expected data EX-D[15:0] with the read data PA-Q[15:0] or PB-Q[15:0], and provides test results to the controller 114 via the output 132 according to differences between the read data from the local address and the expected data. As shown in FIG. 3, the test logic circuit 124 provides 64-bit output signals at the output 132 representing test result data FAIL[63:0]. The example test logic circuit 124 includes first and second exclusive or (XOR) gates 346 and 348. Each of the gates 346 and 348 includes a first input connected to the corresponding read data input 342, 344, and a second input connected to the expected data input 130 through a delay circuit 347 that matches the delay latency of the memory 102. The outputs of the exclusive or gates 346 and 348 are connected to the input of a corresponding AND gate 350, 352. The AND gates 350 and 352 each include an inverted second input connected to the port write enable output 318 that receives the write enable signal WE from the controller output 316. The AND gates 350 and 352 are disabled when the write enable signal WE is active. This connection ensures that the adapter 112 indicates that all write operations are successful during the self-testing of the associated memory 102.

A third input of the first AND gate 350 is connected to the adapter circuit output 340 to receive the first port memory enable signal PA-ME. A third input of the second AND gate 352 is connected to the output 341 to receive the second port memory enable signal PB-ME. The exclusive OR gates 346 and 348 perform a bit-wise comparison of the expected data and the read data from the associated port of the memory 102. When a particular bit of the compared expected data and read data are different, the corresponding exclusive or gate 346 or 348 provides a corresponding active high output signal to the associated AND gate 350 or 352. When the corresponding port is enabled via the associated memory enable signal PA-ME or PB-ME (e.g., from the gates 330 or 331 based on the address range comparison in the type translation circuit 122), and the controller 114 has commanded a read operation, the output of the AND gate 350 or 352 provides an active high output signal indicating a bit error. The outputs of the AND gates 350 and 352 are connected as inputs to an OR gate 354. The gate 354 includes an output 356 that provides a bitwise 16-bit signal FAIL[15:0]. A bus circuit 358 constructs a 64-bit signal at an output 360 with output signals that represent the test result data FAIL[63:0]. In the illustrated example, the bus circuit 358 inserts the 16-bit result FAIL[15:0] from the write/read back data comparison, and the remainder of the 64 bit result are zeros (e.g., D=0[63:16]).

The described adapter circuits 112 significantly reduce boot-time memory test time, while being area efficient and honoring functional boot-time memory test coverage and power constraint requirements. The circuits 112 provide a thin adapter local to each memory 102 to facilitate power-safe parallel memory testing during boot-time using a centralized BIST controller 114. The local adapters 112 perform direct comparison (DC) and return compare pass/fail test results upon read. In one example, writes are returned as passes, and return data from the associated memory 102 back to the controller 114 is merged using an OR-tree in which a fail is encoded as a logic 1 to flag any failing memory. The adapters 112 are configured or configurable to translate the incoming single-port commands to the target memory compiler type (e.g., single port or multi-port). The local adapters 112 also disable the associated memory 102 for invalid addresses for the target memory instance, and control the memory enable signals selectively to reduce instantaneous power. The disclosed examples provide area efficient and power-safe self-test solutions while performing parallel memory testing. The described adapters 112 and self-test circuitry 110 support testing of multiple diverse memories in parallel without similarity or number restrictions. The described examples also allow the use of general purpose BIST controllers that issue single type commands, by the use of the local adapters 112 that map diverse memories into a unified single-port instruction set and schedule parallel test in a power-safe manner. Compared to fully distributed systems that use a dedicated BIST controller for each tested memory, the described examples use a centralized controller 114 and a very thin local adapter 112, where the return path back to the centralized controller is grouped in a hierarchy that is highly area efficient. Moreover, the described circuits and techniques facilitate reduced test time by performing parallel memory tests.

Figure 4:
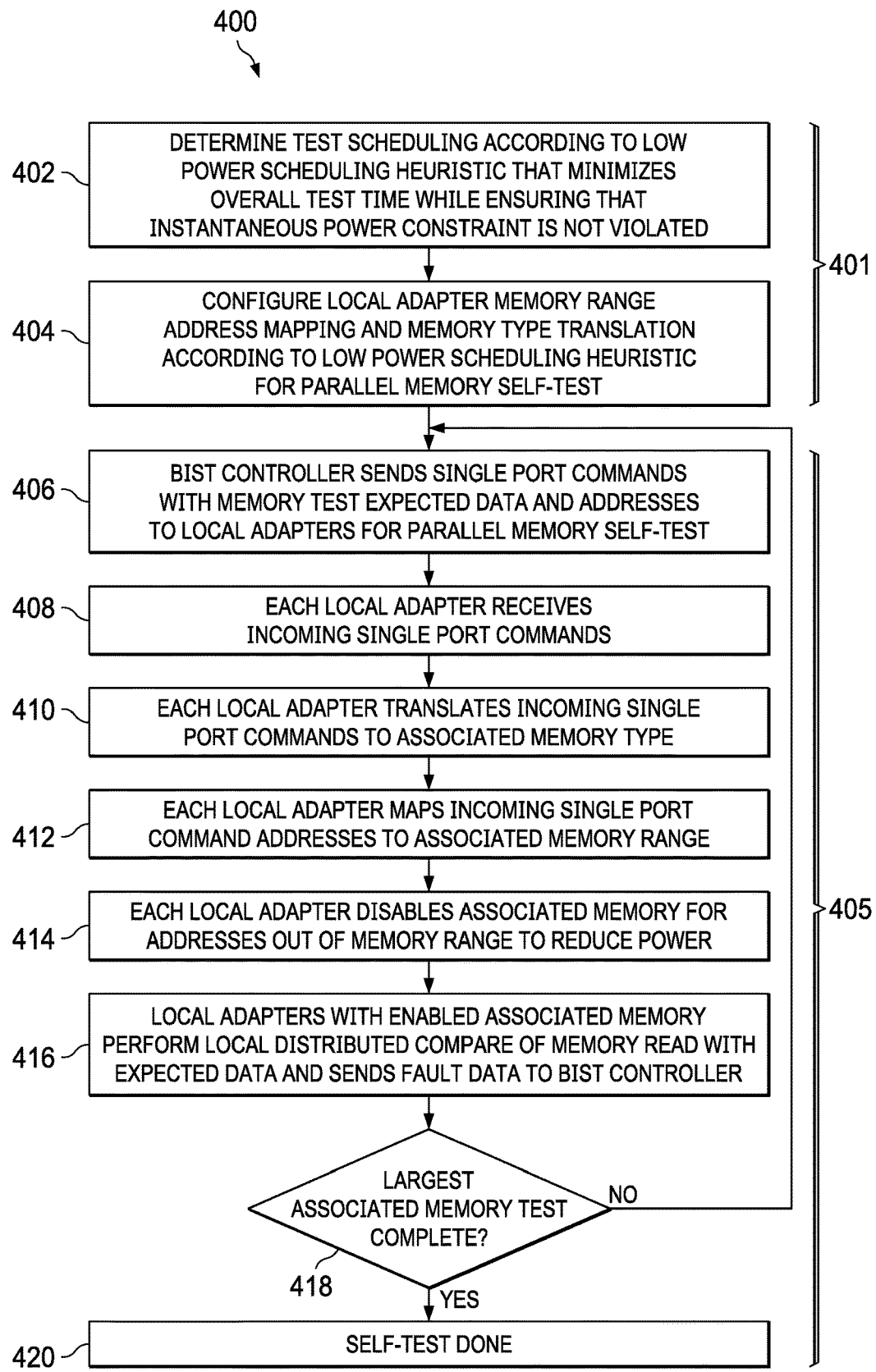
FIG. 4 is a flow diagram of a method of testing multiple memories.

FIG. 4 shows a method 400 of testing multiple memories. The example method 400 includes configuration of local adapters (e.g., 112 hereinabove) at 401. In one example, the configuration process for one includes determining test scheduling according to a low-power scheduling heuristic at 402. The heuristic in one example minimizes overall test time while ensuring that an instantaneous power constraint is not violated. For instance, a built-in self-test of multiple memories in an automotive system may be subject to maximum boot time constraints, as well as power limitations during startup. At 404, local adapter memory range address mapping and memory type translation parameters are configured for local adapters 112 associated with specific local memories 102. The configuration at 404 can be done during manufacturing, or these parameters can be configured during system operation to allow reconfiguration for different memory organizations for a given system.

The method 400 also includes implementing memory testing at 405. At 406, a controller (e.g., BIST controller 114 hereinabove) sends single port commands with memory test expected data and command addresses to local adapters for parallel memory self-testing. At 408, the local adapters individually receive a sequence of commands to be applied to one or more of the memories 102. For each given command received at 408, the individual local adapters 112 translate the incoming single port command to an associated memory type at 410. In one example, the given command is translated at 410 by translating 410 a single port command to a multi-port memory type of the associated memory 102. At 412, the individual local adapters 112 map the command address to a local address of the associated memory 102. In certain examples, each local adapter 112 disables the associated memory at 414 for addresses out of a configured memory range, in order to reduce power during the self-testing. At 416, the local adapters 112 associated with the enabled memories 102 perform local distributed compare functions with respect to memory read data and expected data. At 416, the local adapters 112 also provide test results according to the read data from the local address of the associated memory 102 and the expected data of the given command. A determination is made at 418 as to whether the testing of the largest associated memory has been completed. If not (NO at 418), the processing at 405 continues with the controller sending another command at 406 as described hereinabove. Otherwise (YES at 418), the self-test process is finished at 420.

Figure 5:
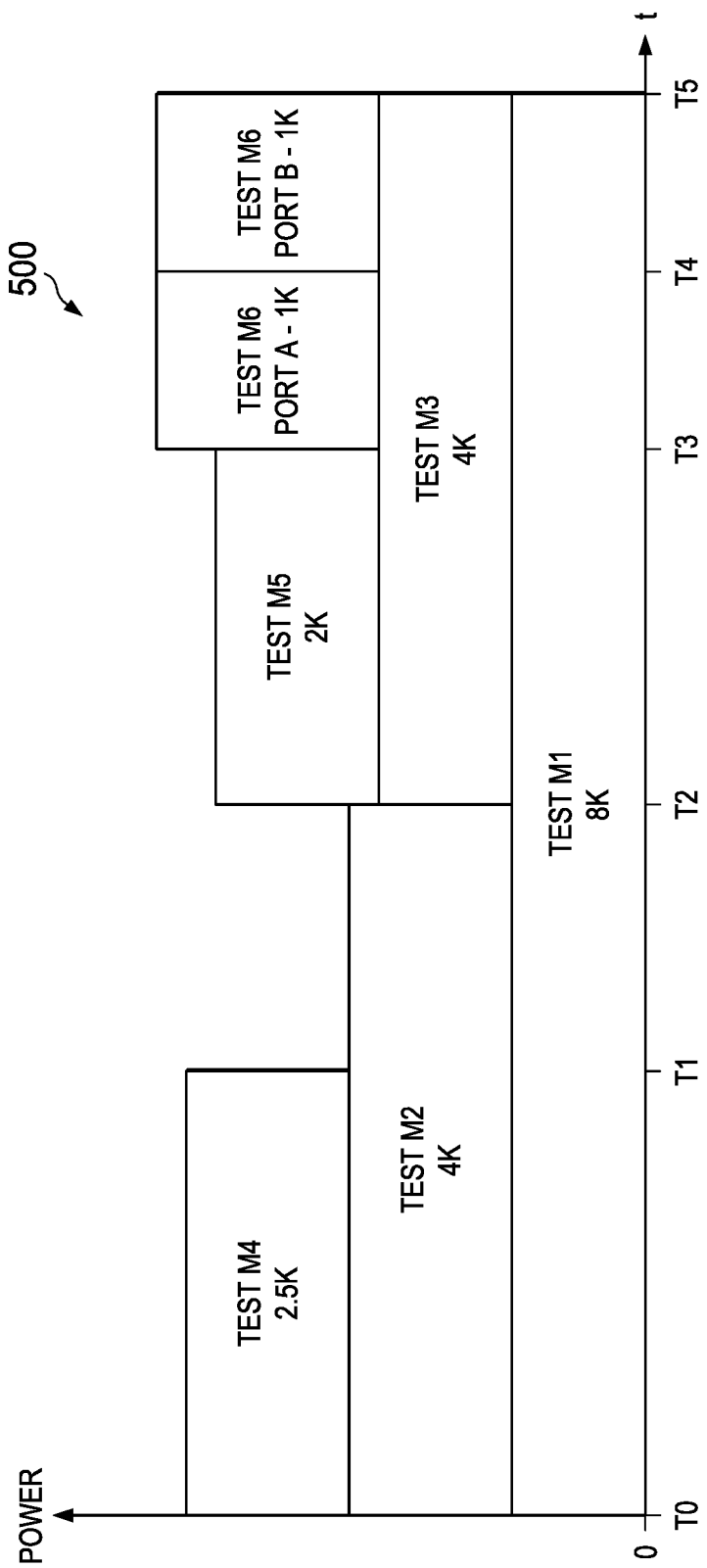
FIG. 5 is a schematic diagram of an example set of six memories illustrating instantaneous power consumption during the parallel memory test.

FIG. 5 shows a power graph 500 that schematically shows the example set of the six memories M1-M6 and illustrates instantaneous power consumption during the parallel memory test. As described hereinabove in connection with FIG. 2, the example test sequence is derived from a low-power scheduling heuristic to test two or more of the memories 102 at any given time during the test sequence, while controlling the instantaneous power consumption of the testing circuitry 110 and the tested memories 102. In this example, all memories M1-M6, across multiple clock-domains, are tested at a uniform pll-bypass frequency. M1 is tested throughout the sequence from T0 through T5. In the graph 500, the instantaneous power at any given time is represented by the top of the uppermost schematically shown memory. From T0 through T1, M1, M2 and M4 are tested with the instantaneous power being determined by the power consumption of the test circuitry 110 and the memories M1, M2 and M4. The testing of M1 and M2 continues from T1 through T2 at a lower instantaneous power level. From T2 through T3, the power consumption increases with concurrent testing of M1, M3 and M5. From T3 through T5, the highest instantaneous power consumption level is reached with the concurrent testing of M1, M3 and M6. In one example, the heuristic creates the illustrated schedule during register transfer level (RTL) generation based on available memories. In this example, moreover, the memories are stored in descending order of their address size. Multi-port memories are scaled based on their number of Write-Read ports. The test schedule length is initially set to the largest memory size, rounded-off to the nearest equal or higher power-of-2. Most significant (MSB) bits are allocated to memory enables to create a schedule in the decreasing order of their address size. If a target functional power constraint is provided, the test schedule length may be increased to create a parallel test schedule that does not exceed the functional power constraint. Other heuristics can be used in different implementations.

Described example provide scalable, area-efficient and power-safe memory self-test architectures using a thin local adapter 112 that maps diverse memories 102 into a unified single-port instruction set and schedules parallel testing in a power-safe manner. Example implementations facilitate differentiated secure automotive/industrial SoCs and other systems to achieve a high safety rating (e.g., ASIL) while satisfying stringent boot-time requirements with any off-the-shelf memory BIST controller. Modifications are possible in the described embodiments, and other embodiments are possible, within the scope of the claims.

What is claimed is:
1. Circuitry to perform parallel testing of a plurality of memories, comprising:
   a plurality of local adapters; and a controller to generate a sequence of commands to be applied to one or more of the plurality of local adapters, each given command of the sequence of commands including expected data, and a command address;

each local adapter being coupled with the controller and with an associated memory of the plurality of memories to:
translate the given command to a memory type of the associated memory;
map the command address to a local address of the associated memory;
transfer the expected data to the local address of the associated memory; and
provide test results to the controller according to read data from the local address of the associated memory and the expected data of the given command.

2. The circuitry of claim 1, wherein each local adapter includes an address mapping circuit to map the command address to the local address of the associated memory, the address mapping circuit including:
an address input coupled to receive first address signals representing the command address; and
a switching circuit to generate second address signals representing the local address of the associated memory according to the first address signals and a configuration signal.

3. The circuitry of claim 2, wherein the address mapping circuit further includes a programmable circuit to provide the configuration signal.

4. The circuitry of claim 2, wherein each local adapter further includes a type translation circuit to disable the associated memory in response to the command address being outside a range.

5. The circuitry of claim 4, wherein the range is programmable.

6. The circuitry of claim 4, wherein each local adapter further includes a test logic circuit to: compare the read data from the local address of the associated memory and the expected data of the given command; and provide the test results to the controller according to differences between the read data from the local address of the associated memory and the expected data of the given command.

7. The circuitry of claim 2, wherein each local adapter further includes a test logic circuit to: compare the read data from the local address of the associated memory and the expected data of the given command; and provide the test results to the controller according to differences between the read data from the local address of the associated memory and the expected data of the given command.

8. The circuitry of claim 1, wherein each local adapter includes a type translation circuit to disable the associated memory in response to command address being outside a range.

9. The circuitry of claim 8, wherein each local adapter further includes a test logic circuit to: compare the read data from the local address of the associated memory and the expected data of the given command; and provide the test results to the controller according to differences between the read data from the local address of the associated memory and the expected data of the given command.

10. The circuitry of claim 1, wherein each local adapter includes a test logic circuit to: compare the read data from the local address of the associated memory and the expected data of the given command; and provide the test results to the controller according to differences between the read data from the local address of the associated memory and the expected data of the given command.

11. The circuitry of claim 1, wherein the plurality of memories, the controller, and the plurality of local adapters are formed in a single integrated circuit.

12. The circuitry of claim 1, wherein each local adapter includes a type translation circuit coupled to translate a single port command to a multi-port memory type of the associated memory.

13. The circuitry of claim 12, wherein:
each local adapter includes an address mapping circuit to map a command address range into local address ranges for each port of an associated multi-port memory; and
the type translation circuit is configured to:
enable a selected port of the associated multi-port memory and disable other non-selected ports of the associated multi-port memory in response to the command address being in the local address range of the selected port; and
disable all ports of the associated multi-port memory in response to the command address being outside the local address ranges of each port of the associated multi-port memory.

14. An adapter circuit to interface an associated memory with a controller, the adapter circuit comprising:
an address mapping circuit to map a command address to a local address of the associated memory, the address mapping circuit including a switching circuit coupled to:
receive first address signals, the first signals representing the command address;
generate second address signals representing a local address of the associated memory according to the first address signals and a configuration signal;
receive test expected data; and
transfer the expected data to the local address of the associated memory;
a type translation circuit to disable the associated memory in response to the command address being outside a range; and
a test logic circuit coupled with the associated memory to: receive read data from the local address of the associated memory; compare the read data from the local address with the expected data; and provide test results according to differences between the read data from the local address and the expected data.

15. The adapter circuit of claim 14, wherein the address mapping circuit further includes a programmable circuit to provide the configuration signal.

16. The adapter circuit of claim 15, wherein the type translation circuit is configured to translate a single port command to a multi-port memory type of the associated memory.

17. The adapter circuit of claim 16, wherein:
the address mapping circuit is configured to map a command address range into local address ranges for each port for an associated multi-port memory; and
the type translation circuit is configured to:
enable a selected port of the associated multi-port memory and disable other non-selected ports of the associated multi-port memory in response to the command address being in the local address range of the selected port; and
disable all ports of the associated multi-port memory in response to the command address being outside the local address ranges of each port of the associated multi-port memory.

18. A method of parallel testing a plurality of memories, comprising:
 receiving, by an adapter, a sequence of commands to be applied to one or more of the plurality of memories, each given command of the sequence of commands including expected data, and a command address;
 for each given command:
  translating, by the adapter, the given command to a memory type of the associated memory;
  mapping, by the adapter, the command address to a local address of the associated memory; and
  providing, by the adapter test results according to read data from the local address of the associated memory and the expected data of the given command.

19. The method of claim 18, further comprising, for each given command:
 disabling, by the adapter, the associated memory if the command address is outside a range.

20. The method of claim 18, wherein translating the given command to the memory type of the associated memory includes translating a single port command to a multi-port memory type of the associated memory.

\* \* \* \* \*